United States Patent [19]

Kingsley

[11] Patent Number: 5,299,137
[45] Date of Patent: Mar. 29, 1994

[54] BEHAVIORAL SYNTHESIS OF CIRCUITS INCLUDING HIGH IMPEDANCE BUFFERS

[75] Inventor: Christopher H. Kingsley, San Jose, Calif.

[73] Assignee: VLSI Technology, Inc., San Jose, Calif.

[21] Appl. No.: 970,601

[22] Filed: Oct. 28, 1992

Related U.S. Application Data

[63] Continuation of Ser. No. 505,288, Apr. 5, 1990, abandoned.

[51] Int. Cl.$^5$ .............................................. G06F 15/60
[52] U.S. Cl. ...................................... 364/489; 364/488
[58] Field of Search ................ 364/488, 489, 490, 491

[56] References Cited

U.S. PATENT DOCUMENTS

| | | | |
|---|---|---|---|
| 4,703,435 | 10/1987 | Darringer | 364/489 |
| 4,813,013 | 3/1989 | Dunn | 364/488 |
| 4,945,503 | 7/1990 | Takasaki | 364/491 |
| 4,967,367 | 10/1990 | Piednoir | 364/490 |
| 5,005,136 | 4/1991 | Van Berkel et al. | 364/490 |
| 5,031,111 | 7/1991 | Chao et al. | 364/491 |
| 5,157,668 | 10/1992 | Buenzli, Jr. et al. | 364/489 |

FOREIGN PATENT DOCUMENTS 1445914  8/1976  United Kingdom ................ 364/490

Primary Examiner—Vincent N. Trans
Attorney, Agent, or Firm—Hickman & Beyer

[57] ABSTRACT

A behavioral design tool which is capable of designing circuits including high impedance buffers from hardware description language specifications. The design tool includes a behavioral synthesizer including a net expression routine, a high impedance structure and control expression routine (HI-Z routine) and a structure synthesis routine. The net expression routine reduces the hardware description language to net expressions which are analyzed by the HI-Z routine to look for high impedance states. If a high impedance state is found in a net expression the HI-Z routine develops the structure for an associated high impedance buffer and an associated high impedance control expression. The structure synthesis routine utilizes the net expressions, control expressions and high impedance buffers to develop circuits which realize the behavior described in the hardware description language.

23 Claims, 4 Drawing Sheets

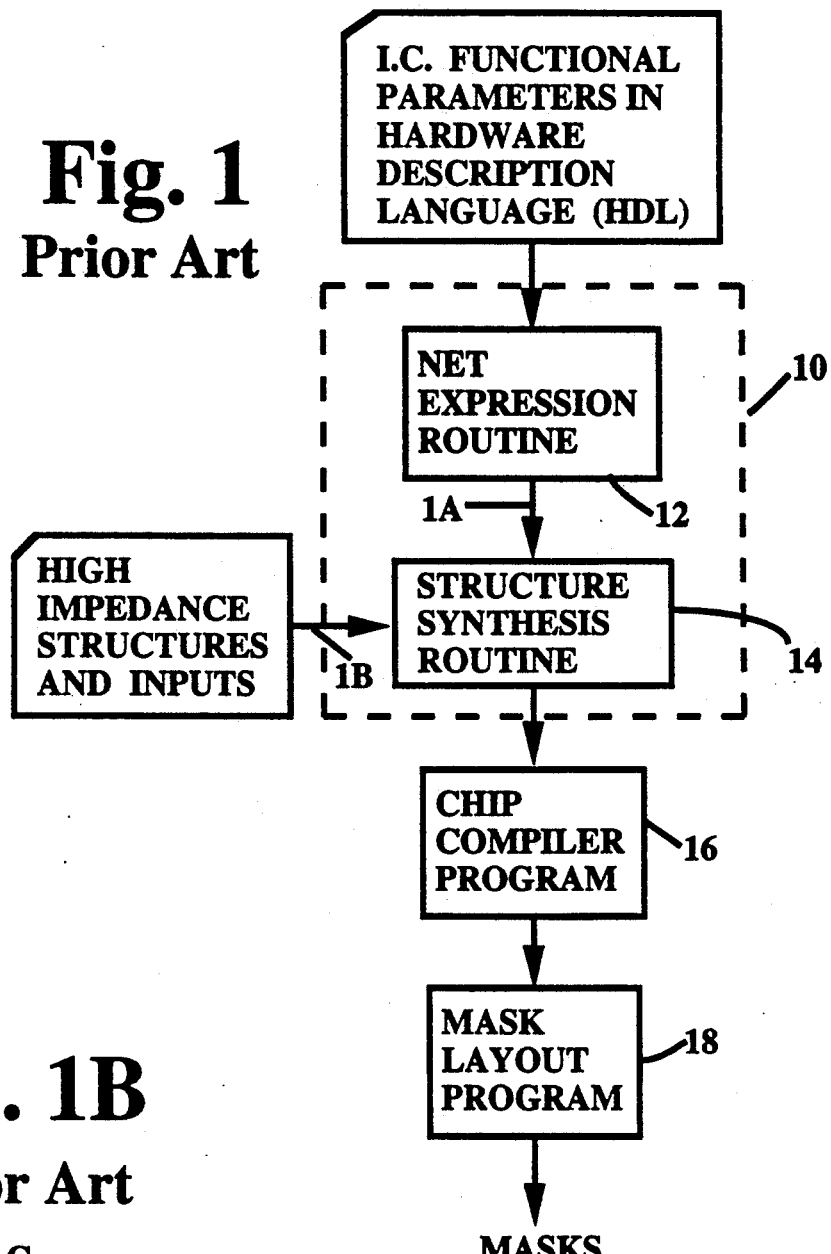
Fig. 1 Prior Art
Fig. 1B Prior Art
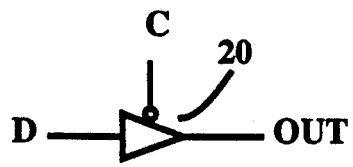
| D | C | OUT |
|---|---|-----|
| 0 | 0 | 0 |
| 1 | 0 | 1 |
| X | 1 | Z |
A = { NET EXPRESSION }
Fig. 1A Prior Art

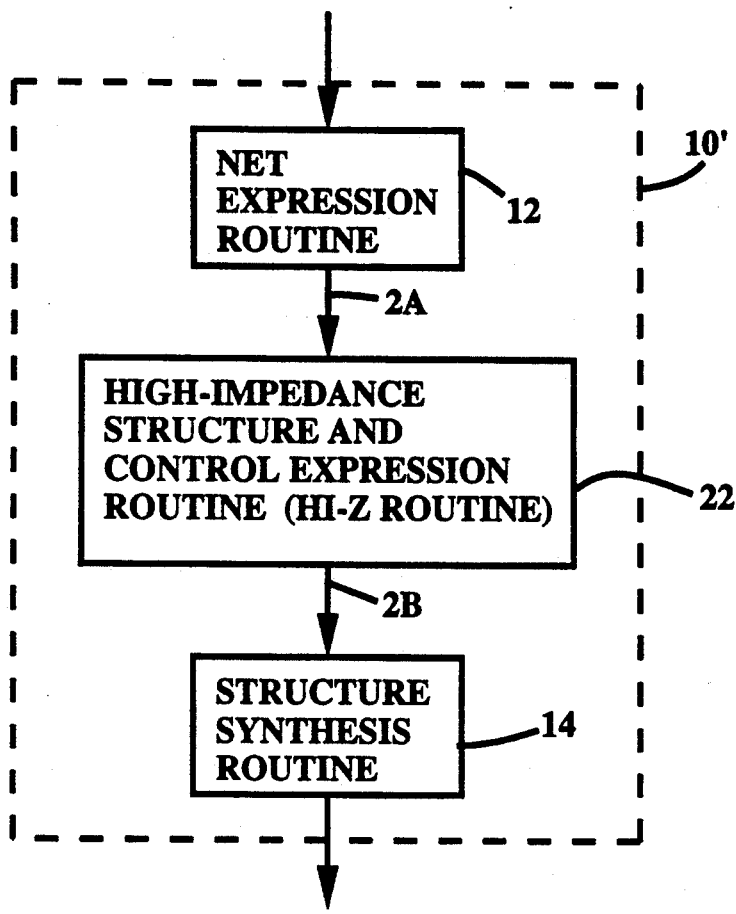
Fig. 2
Fig. 2A
A = { NET EXPRESSION }
Fig. 2B
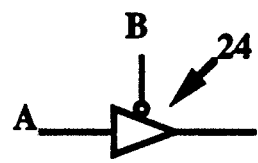
A = { NET EXPRESSION }
B = { OENEXPR }

BEHAVIORAL SYNTHESIS OF CIRCUITS INCLUDING HIGH IMPEDANCE BUFFERS

This is a continuation of copending application(s) Ser. No. 07/505,288 filed on Apr. 5, 1990 now abandoned.

BACKGROUND OF THE INVENTION

This invention relates generally to the design of electronic circuits and more particularly to the automated design of integrated circuits by means of behavioral synthesis tools.

The motivation for automation of integrated circuit design is the ever increasing complexity of integrated circuits. Since 1960 the number of gates on an integrated circuit chip has doubled approximately every two years. Currently, it is not unusual for a single integrated circuit chip to include hundreds of thousands of gates. Behavioral synthesis tools are emerging to help integrated circuit designers to deal with this complexity.

A behavioral synthesis tool typically comprises a behavioral synthesis program running on a general purpose digital computer. Ideally, the behavioral synthesis program takes a user's description of a circuit's behavior and then produces a corresponding circuit structure. By "behavior" it is meant that a user does not have to describe the structural components of a circuit but rather what the circuit does and how it operates. This user's description is written in a hardware description language (HDL) such as VERILOG (a trademark of Cadence, Inc.) or the public domain language VHDL. The VHDL hardware description language is specified by the IEEE as VHDL standard version 1076B which was released in 1987.

In FIG. 1, a prior art routine for producing integrated circuit masks from a hardware description language is shown. A behavioral synthesis program 10 typically includes a net expression routine 12 (sometimes called a level one synthesis routine) and a structure synthesis routine 14 (sometimes called a level two synthesis routine). The behavior of an integrated circuit (I.C.) is coded into a hardware description language and is received by the net expression routine 12 which produces a series of net expressions as illustrated by the single net expression in FIG. 1A. A net expression is a parse graph or tree which defines the output of a circuit solely in terms of its input signals. Examples of net expressions include: "IN1+IN2+CARRY"; "(e2)?e1:e2;" and "C." These net expressions are input into the structure synthesis routine 14 which produces gate-level descriptions of the I.C. circuitry. Behavioral synthesizers incorporating net expression routines and structure synthesis routines are commercially available from Synopsis, Inc.

The gate-level descriptions provided by a behavioral synthesis program 10 can be further processed in a chip compiler program 16 which produces device-level descriptions of the circuitry and in a mask layout program 18 which will use the device-level descriptions produced by the chip compiler to produce production-worthy integrated circuit masks. Chip compiler programs and mask layout programs are commercially available from VLSI, Inc. of San Jose, Calif.

A problem with prior art behavioral synthesis programs is that they cannot directly synthesize the circuit structure for a high impedance buffer. As a result, integrated circuit designers had to manually specify the structure, data inputs and control inputs for every high impedance buffer they wished to design into the circuit. This is illustrated in FIGS. 1 and 1B where the high impedance structures 20 and inputs D(data) and C(control) must be manually entered into the structure synthesis routine 14 by the circuit designer.

This step of manually entering the high impedance structure and inputs into the structure synthesis routine partially defeats the purpose of the behavioral synthesizer program, which is to free the integrated circuit designer from gate-level design work. Despite the disadvantages of manually specifying high impedance structures and control signals, designers of behavioral synthesis programs have not previously supported the synthesis of high impedance structures due to the complexities of handling high impedance states within the net expression routine.

SUMMARY OF THE INVENTION

The present invention automatically generates high impedance structures and input signals when high impedance states are specified in a hardware description language. The clear advantage of this capability is the further automation of the integrated circuit design process.

Rather than developing the control expressions for high impedance structures directly from the hardware description language, the present invention preferentially takes the output of the net expression routine and runs it through a high impedance structure and control expression routine (HI-Z routine). Within the HI-Z routine, the net expressions are analyzed for high impedance states, and high impedance structures and control expressions are automatically generated when appropriate. The net expressions, the high impedance structures, and the high impedance control expressions are input into the structure synthesis routine for automatic gate-level synthesis.

The present invention therefore allows an integrated circuit designer to specify high impedance states at the hardware description language level thereby saving time and reducing the complexity of the circuit design task. Because the invention preferentially operates on the net expressions provided by the net expression routine, its implementation efficient and relatively straightforward.

These and other advantages of the present invention will become clear to those skilled in the art upon a study of the detailed description of the invention and of the several figures of the drawings.

BRIEF DESCRIPTION OF THE DRAWINGS

FIG. 1 is a block diagram of a prior art method for generating integrated circuit masks including a behavioral synthesis program, chip compiler program, and a mask layout program;

FIG. 1A is an example of a prior art output of the Net Expression Routine at point 1A in FIG. 1;

FIG. 1B illustrates the prior art manual input into the Structure Synthesis Routine at point 1B in FIG. 1;

FIG. 2 is a block diagram of an improved Behavioral Synthesis Program including a High Impedance Structure and Control Expression Routine (HI-Z routine);

FIG. 2A is an example of an output of the Net Expression Routine at a point 2A in FIG. 2;

FIG. 2B illustrates an output of the HI-Z routine at a point 2B in FIG. 2;

DETAILED DESCRIPTION OF THE PREFERRED EMBODIMENTS

Figure 3:
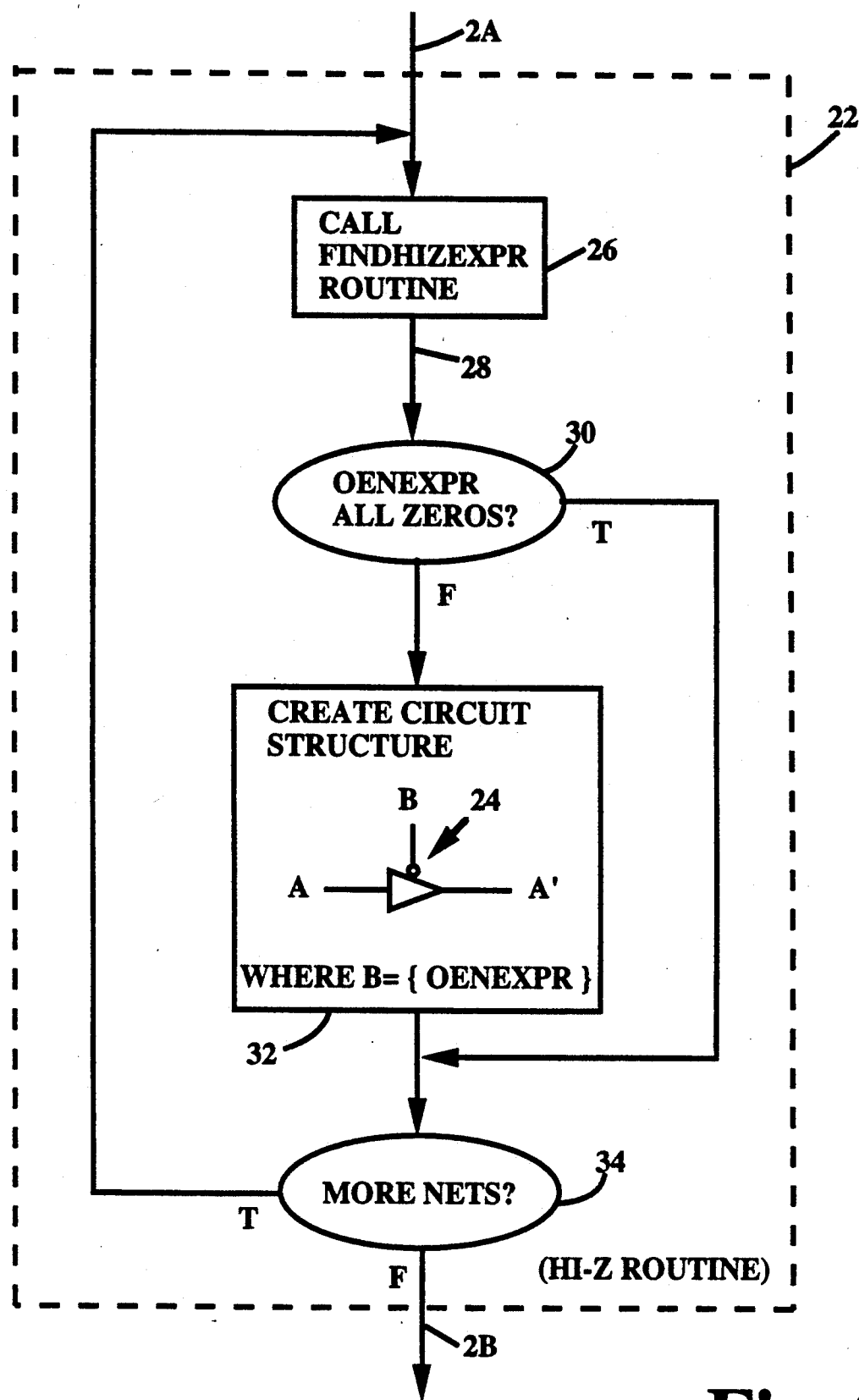
FIG. 3 is a block diagram of the internal processes of the HI-Z routine shown in FIG. 2.

The present invention comprises a behavioral synthesis tool which, as mentioned previously, includes both a behavioral synthesis program and a hardware platform upon which it operates. The hardware platforms may be, and preferably are, general purpose digital computers such as engineering workstations, minicomputers and mainframe computers. Alternatively, the hardware platforms may be custom designed digital computers which incorporate some or most of the behavioral synthesis program into the hardware of the system.

Prior art behavioral synthesis programs were described with reference to FIGS. 1, 1A and 1B. In FIG. 2, a behavioral synthesis program 10 constructed in accordance with the present invention is shown in high-level, block diagram form. The net expression routine 12 is similar to that found in the prior art, as is the structure synthesis routine 14. A high impedance structure and control expression routine, hereafter referred to as HI-Z routine 22, is not known in the prior art either as an independent routine or as an integral portion of a behavioral synthesis program.

As seen in FIG. 2, HI-Z routine 22 has an input signal 2A comprising a series of net expressions such as the net expression for "A" shown in FIG. 2A. The output signal 2B of HI-Z routine 22 (as illustrated in FIG. 2B) includes the specifications of a tri-state or high impedance buffer 24, a series of net expressions such as the net expression "A" and a series of high impedance control expressions such as the high impedance control expression "B". Structure synthesis routine 14 uses the net expressions, control expressions and high impedance buffer structures to automatically synthesize circuits having high impedance buffers.

The HI-Z routine 22 is shown in grater detail in FIG. 3. In a first step 26, the HI-Z routine 22 passes a net expression from input signal 2A to a FINDHIZEXPR routine, which will be discussed in greater detail with reference to FIG. 4. The routine 26 issues an output enable expression OENEXPRA or signal 28. In a conditional step 30, OENEXPRA is analyzed to determine whether all binary digits of this expression are zero, i.e., whether the output enable expression OENEXPR is a null. As used herein, "null" means any pattern or code indicating that there are no high impedance states whatsoever in the associated net expression. Conveniently, the present invention uses an all zeros expression as a null, but it could equally well use an all ones expression as a null or some other pattern or code to indicate nullity.

If the net expression is not a null, the net expression with which OENEXPR is associated includes at least one high impedance state, and the high impedance buffer structure 24 must be created in a step 32. Also within step 32 the high impedance control expression B is assigned the value of the output enable expression OENEXPR.

If the output enable expression OENEXPRA has been determined to be a null in step 30, or if step 32 has already been performed, a determination is made in a conditional step 34 whether there are any more net expressions to be processed. If there are, the HI-Z routine 22 is repeated, beginning from step 26. If all net expressions have been processed, the HI-Z routine has completed its task, and the routine returns control to the structure synthesis routine 14 for level two synthesis.

Figure 4:
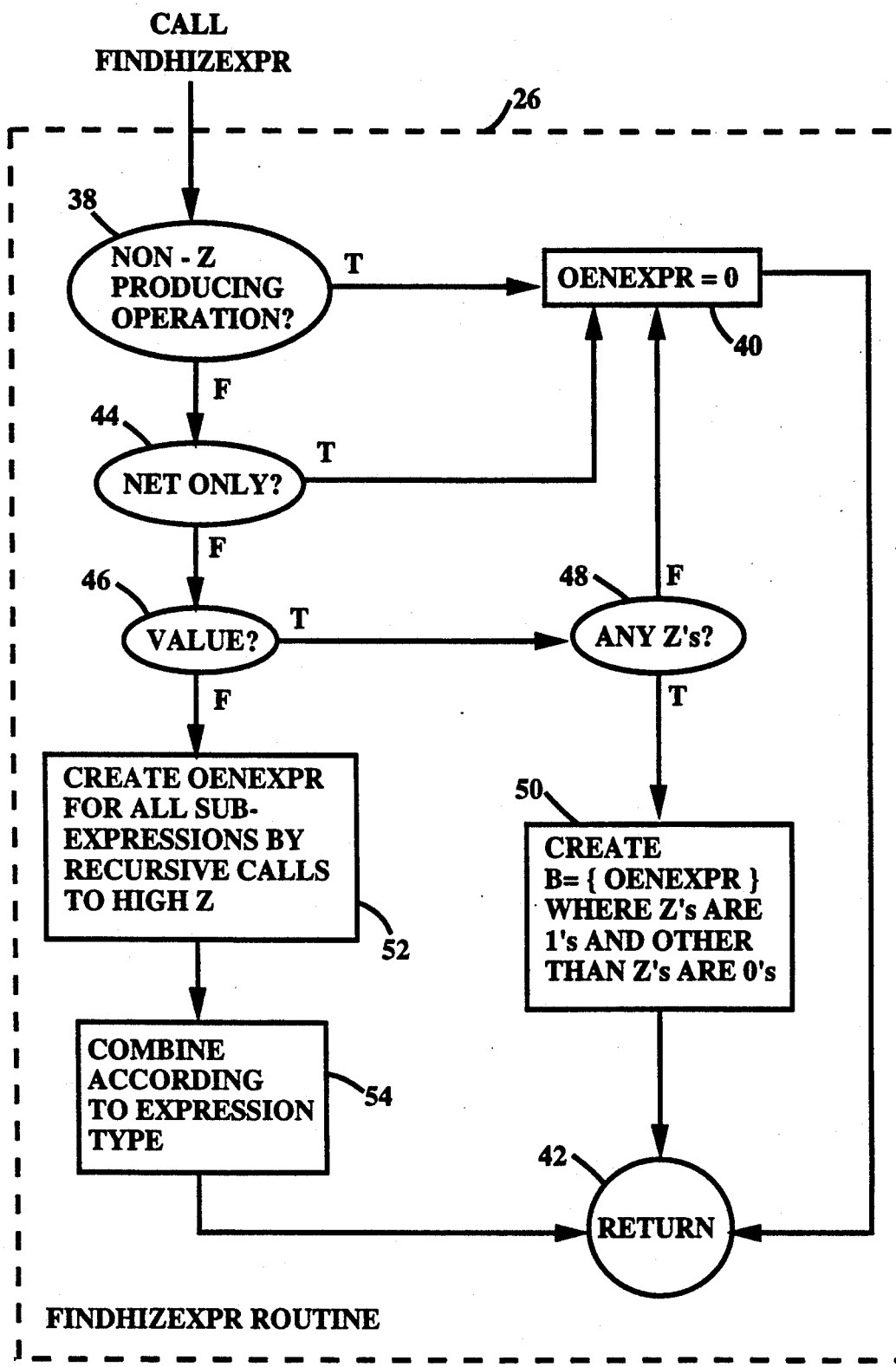
FIG. 4 is a block diagram of the internal processes of the FINDHIZEXPR routine shown in FIG. 3.

In FIG. 4 the routine FINDHIZEXPR 26 is shown in detail. Routine FINDHIZEXPR 26 is recursive, i.e. it can call itself recursively and without limitation. The first step within routine FINDHIZEXPR 26 is a conditional step 38 which examines a net expression for operations which never produce a high impedance state. Examples of such operations include addition, multiplication, greater-than, less-than, etc. If the net expression contains only operations which would never produce a high impedance state, the output enable expression OENEXPR is set to,, null in a step 40 and the call to routine FINDHIZEXPR 26 is terminated in a return step 42.

If, in conditional step 38, it is determined the net expression does include operations which can produce at least one high impedance state, the net expression is examined in a conditional step 44 to determine whether this net expression is a "net only" net expression, such as A=C. If this expression is a net only net expression, OENEXPR is set equal to a null expression in step 40 and control is returned the calling routine in step 42.

If the next expression is not found to be a net only expression in step 44, the net expression is examined in a conditional step 46 to determine whether the net expression is a "value only" expression, such as A=011ZZ010. If this next expression is a value only expression, a conditional step 48 determines whether this net expression produces one or more high impedance states within the net expression. If not, the expression OENEXPR is set to null in step 40 and control is returned to the calling routine in step 42. If the net expression is a value only expression with at least one high impedance state, step 50 causes OENEXPR to manifest the high impedance state produced by the net expression. By way of example, one way that OENEXPR can reflect the high impedance states of the net expression is to set the bits of OENEXPR equal to "1" wherever the net expression indicates a high impedance state and equal to "0" elsewhere. In this example, for the net expression A =011ZZ010, the expression OENEXPR created by step 50 would be B=O-ENEXPR=00011000. Of course, there are other ways by which OENEXPR may manifest the high impedance states of the net expression, such as setting corresponding equal to "0" to indicate a high impedance state in the net expression and equal to "1" elsewhere.

If this net expression is not found to be a value only expression in step 46, it has been effectively determined this next expression is composed of two or more sub-expressions. For example, for expression A=IN1-+IN2, the sub-expressions are $A_1$=IN1 and $A_2$=IN2 where A=$A_1$+$A_2$. $A_1$ and $A_2$ can, in turn, have their own sub-expressions. Each of these sub-expressions is analyzed in turn by recursively calling routine FIND-HIZEYPR 26 in a recursive call step 52. Once all sub-expressions and their sub-expressions have been analyzed, they are combined in a combinational step 54 according to their expression type to create OENEXPR, after which control is returned to the calling routine in return step 42.

An example of a routine FINDHIZEXPR is illustrated in Appendix A. This routine is written in MAIN-SAIL a PASCAL-like language provided by Xidak, Inc. of Menlo Park, Calif. Lines 1 and 2 are comment lines, while lines 3-10 are the internal variable definitions. In line 12, OENEXPR is set to a one-bit-wide null expression if the net equation is a null. In line 14, the expression OENEXPR is set equal to a null if the net expression is a net only expression. In line 16, value only net expression are set equal to nulls, and in lines 17-19 the bits of OENEXPR are caused to reflect the high impedance states of the value only net expressions by setting the corresponding bits of OENEXPR to 1 whenever a high impedance state is detected in the net expression. Line 20 begins the routine which handles a net expression which may require recursive calls to routine FINDHIZEXPR to analyze the next expression sub-expressions. In lines 24 and 25, the operator "If" in line 20 is analyzed by recursive calls to FINDHIZEXPR to create a sub-control expressions which are combined in line 26 to create OENEXPR. Similarly, the operator "Extract" in line 28 is analyzed by recursive calls to FINDHIZEXPR in line 29 and the sub-expressions are combined to form OENEXPR in lines 30-31; the operator "Decode" in lie 33 is analyzed by a recursive call to FINDHIZEXPR in line 36 and combined to form OENEXPR in line 37; the operator; "Concatenate" in line 39 is analyzed by a recursive call in line 42 and combined to form OENEXPR in line 43; and the operators Shift-Left and Shift-Right in line 45 are analyzed by a recursive call in line 46 and are combined to form OENEXPR in lines 47 and 48. It should be noted that the recursive calls which analyze the sub-expressions may, in turn, create further recursive calls which analyze their own sub-expressions and so forth. In any event, once the net expression has been analyzed according to all of its sub-expressions, the sub-expressions are combined according to their type to form the final output enable expression OENEXPR. Finally, for all next expressions which cannot contain high impedance states, OENEXPR. Finally, for all next expressions which cannot contain high impedance states, OENEXPR is set to a null expression in line 53.

It will be noted that the routines FINDHIZEXPR 26 of FIG. 4 and of Appendix A do not coincide in the order in which the net equations are analyzed. This illustrates the important point that there are many ways to express the same functionality when dealing with software routines. For example, in FIG. 4 it is irrelevant whether the conditional step 38 which looks for high impedance operations is performed before or after the conditional step 44 which looks for net only net expressions. This is, of course, true for all of the routines described herein: the routines are by way of example only, and not limitation.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

---

Appendix A

```
# Tell when a thing is high impedance. Returns a thing that is "1" whenever the original
# thing was "Z" and zero otherwise.
procedure findHiZExpr (
        pointer (thing) th;
        produces pointer (thing) oenExpr);
begin
        pointer (Expr) expr;
        pointer (Thing) oenLeft, oenRight;
        pointer (Thing) array (0 to *) sub;
        integer i,n,j;
        if not th then begin
                oenExpr:=zeroValue(1);      # one-bit wide Zero
        end else.if typeOf(th)=netType then begin
                oenExpr:=zeroValue(widthOf(th));
        end else if typeOf(th)=valueType then begin
                oenExpr:=zeroValue(widthOf(th));
                for i=widthOf(th)-1 downto 0 do
                        if getBit(th,i)=valueZ then
                                setBit(oenExpr,value1,i);
        end else if typeOf(th)=exprType then begin
                expr:=th;
                case opOf(expr) of begin
                [opIf] begin
                                findHiZExpr(expr,left,oenLeft);
                                findHiZExpr(expr,right,oenRight);
                                oenExpr:=newTrinaryExpr(opIf,expr.ctrl,oenLeft,oenRight);
                        end;    #IF-expr
                [opExtract] begin
                                findHiZExpr(expr,ctrl,oenLeft);
                                oenExpr:=extractSubExpr(expr,ctrl,oenLeft,expr.left,expr.right
                                        widthOf(expr));
                        end;
                [opDecode]] begin
                                new(sub,0,expr.sub.ub1);
                                for i=0 upto expr.sub.ub1 do
                                        findHiZExppr(expr.sub[i]sub[i]);
                                oenExpr:=newPolyExpr(opDecode,expr.ctrl.sub);
                        end;
                [opConcat] begin
                                new(sub,0,expr.sub.ub1);
                                for i=0 upto expr.sub.ub1 do
                                        findHiZExpr(expr.sub[i],sub[i]);
                                oenExpr:=newPolyExpr(opConcat,nullpointer,sub);
                        end;
                [opShr] [opShl] begin
```

-continued

Appendix A

```
            findHiZExpr(expr.left,oenLeft);
            oenExpr:=newBinaryExpr(opOf(expr),oenLeft,expr.right,
                widthOf(expr));
        end;
    [ ] begin   # Default condition for all expressions that can't pass through
                # high impedance values, like addition, multiplication,
                # greater-than, etc.
            oenExpr:=zeroValue(widthOf(expr));
        end;
    end;            # end case on expr type
  end;              # end of exprs
end;        #end findHiZExpr
```

Appendix B

Glossary

Behavioral Synthesis Pro ram: A program running on a digital computer which creates gate-level circuitry from a behavioral description of how the circuit should work.

Behavioral Synthesis Tool: The combination of a behavioral synthesis program and a digital computer.

FINDHIZEXPR routine: A software routine which analyzes net expressions and returns OENEXPR.

HDL: Hardware Description Language. A user of a behavioral synthesis tool inputs the desired behavior of a circuit into the tool by means of a specialized hardware description language.

High Impedance Control Expression: This expression defines the control input to a high impedance buffer. The data input to the high impedance buffer is the associated net expression.

HI-Z routine: This software routine takes a net expression, analyzes it for high impedance states and develops the structure of a high impedance buffer and a high impedance control expression whenever the net expression includes at least one high impedance state.

Level One Synthesis: A software routine which decomposes a series of hardware description language commands into a series of net expressions.

Level Two Synthesis: A software routine which converts a series of net expressions into gate-level circuitry.

Net Expression: An acyclic graph or tree developed from the hardware description language commands which express all circuit outputs solely in terms of their inputs.

Net Only Expression: A net expression containing only another net expression.

Null: As used herein, a condition in the HI-Z routine and the FINDHIZEXPR routine signifying that no high impedance states are associated with a particular net expression.

OENEXPR: Output Enable Expression. This expression is generated by the FINDHIZEXPR routine and becomes the high impedance control expression in the HI-Z routine if it is not a null expression.

Reflect: A first expression is reflected by a second expression if the second expression encodes the high-impedance states of the first expression.

Sub-Control Expression: The control expression associated with a sub-expression.

Sub-Expression: Expressions within other expressions, i.e. an expression within a net expression or within another sub-expression.

Value Only Expression: A net expression including only a value.

VERILOG: A HDL provided by Cadence, Inc.

VHDL: A public domain HDL developed as part of a Very High Speed Integrated Circuit (VHSIC) hardware program and specified by the IEEE.

What is claimed is:

1. A method for synthesizing circuit structures comprising the steps of:

firstly, reducing a series of hardware description language commands to a series of net expressions on a digital computer;

secondly, analyzing said series of net expressions for the presence of high impedance states on said digital computer and producing an associated high impedance control expressions when one or ore high impedance states are found;

thirdly, synthesizing a circuit specified by said hardware description language commands on said digital computer by utilizing said net expressions and said high impedance control expressions; and fourthly, transforming said synthesized circuit into a plurality of integrated circuit masks for producing integrated circuits embodying the functionality specified by said hardware description language commands.

2. A method for synthesizing circuit structures as recited in claim 1, wherein said second step further comprises producing the specification of a high impedance buffer together with the production of a high impedance control expression and wherein said third step further comprises utilizing said specification of said high impedance buffer to synthesize said circuit.

3. A method for synthesizing circuit structures as recited in claim 1, further comprising the step of setting said high impedance control expression is equal to a null when said net expression contains only operations which never result in one or more high impedance states.

4. A method for synthesizing circuit structures as recited in claim 1, further comprising the step of setting said high impedance control expression is a null when said net expression is a net only expression.

5. A method for synthesizing circuit structures as recited in claim 1, further comprising the step of setting said high impedance control expression is equal to a null when said net expression is a value only expression with no high impedance states and said high impedance control expression to reflect said net expression when said net expression is a value only net expression which includes at least one high impedance state.

6. A method for synthesizing circuit structures as recited in claim 1, further comprising the step of analyzing and combining all sub-expressions to create said high impedance control expression.

7. A method for synthesizing circuit structures as recited in claim 1, wherein:
   said high impedance control expression is set equal to a null when said net expression contains only operations which never result in one or more high impedance states;
   said high impedance control expression is set equal to a null when said net expression is a net only expression;
   said high impedance control expression is set equal to a null when said net expression is a value only expression with no high impedance states and wherein said high impedance control expression reflects said net expression when said net expression is a value only net expression which includes at least one high impedance state; and
   if a net expression contains two or more sub-expressions, this collection of sub-expressions is analyzed and combined to create said high impedance control expression.

8. A behavioral synthesizer tool for the automated design of integrated circuit masks comprising:
   net expression generation means implemented on a digital computer for receiving a series of hardware description language commands and for reducing these commands to a series of net expressions, wherein said series of hardware description language commands embody the behavior of a desired circuit;
   high impedance generation means implemented on said digital computer for analyzing each of said net expressions for the presence of high impedance states in said series of net expressions, for producing a high impedance control expression for each net expression which contains a high impedance state, and for producing another type of control expression for each net expression which does not contain one or more high impedance states;
   structure synthesis means implemented on said digital computer responsive to said net expressions and said high impedance control expressions and operative for developing a circuit which reflects the desired behavior; and
   means for transforming said circuit into a plurality of integrated circuit masks for producing integrated circuits embodying the functionality specified in said hardware description language commands.

9. A behavioral synthesizer tool as recited in claim 8, wherein said high impedance generation means receives an input signal that includes said net expressions and an output signal that includes both said next expressions and said high impedance control expressions.

10. A behavioral synthesizer tool as recited in claim 8, wherein said output signal issued by said high impedance generation means further produces a specification of high impedance buffer when a net expression includes a high impedance state.

11. A behavioral synthesizer tool as recited in claim 10, wherein said high impedance generation means includes means for determining when said high impedance control expression is a null and for creating said specification of a high impedance buffer when high impedance control expression is not equal to a null.

12. A behavioral synthesizer tool as recited in claim 11, wherein said means for generating said high impedance control expression includes means for recognizing operations within a net expression which never result in a high impedance state and operative to set said high impedance control expression equal to a null.

13. A behavioral synthesizer tool as recited in claim 11 wherein said means for generating said high impedance control expression includes means for recognizing net only expressions and operative to set said high impedance control expression corresponding to a net only expression equal to a null.

14. A behavioral synthesizer tool as recited in claim 11, wherein said means for generating said high impedance control expressions includes means for recognizing a value only net expression and operative to set said high impedance control expression equal to a null when the value only net expression does not include one or more high impedance states and operative to set said high impedance control expression to reflect said net expression when said net expression includes at least one high impedance state.

15. A behavioral synthesizer tool as recited in claim 11, wherein said means for generating said high impedance control expressions includes means for recognizing when a net expression includes two or more sub-expressions, for creating sub-control expressions for all sub-expressions of each net expression that includes two or more sub-expressions, and for combining these sub-control expressions according to expression type to create said high impedance control expression for said net expression.

16. A behavioral synthesizer tool as recited in claim 11, wherein said means for generating said high impedance control expressions includes:
   means for recognizing operations within a net expression which never result in a high impedance state and operative for setting said high impedance control expression equal to a null;
   means for recognizing net only expressions and operative for setting said high impedance control expression corresponding to a net only expression equal to a null;
   means for recognizing a value only net expression, operative for setting said high impedance control expression equal to a null when the value only net expression does not include one or more high impedance states, and operative to set said high impedance control expression to reflect said net expression when said net expression includes at least one high impedance state; and
   means for recognizing when a net expression includes two or more sub-expressions, for creating sub-control expressions for all sub-expressions of each net expression that includes two or more sub-expressions, and for combining these sub-control expressions according to expression type to create said high impedance control expression for said net expression.

17. A method for creating a high impedance control expressions from a net expression for synthesizing circuit structures comprising the steps of:
   (a) reducing a series of hardware description language commands to a series of net expressions on a digital computer;
   (b) setting a high impedance control expression equal to a null using at least one of the following criteria;
      (i) if a net expression does not include any high impedance operations;
      (ii) if said net expression is a net only expression; and (iii) if said net expression is a value only net expression without any high impedance states;

(c) if said net expression is a value only expression having at least one high impedance state, setting the high impedance control expression to reflect the high impedance state(s) of said net expression;

(d) if said net expression contains two or more sub-expressions, repeatedly performing steps (a) and (b) until all sub-expressions in the net expression have been resolved into sub-control expressions to create said high impedance control expression;

(e) repeating steps (b) through (d) for each of said series of net expressions to create a series of high impedance control expressions;

(f) synthesizing a circuit specified by said hardware description language commands on said digital computer by utilizing said net expressions and said high impedance control expressions; and (g) using said synthesized circuit in the manufacture of an integrated circuit that embodies the functionality specified by said hardware description language commands.

18. Behavioral synthesis apparatus for automated design of electronic circuits, the apparatus comprising:
(1) a net expression generator implemented on a digital computer to receive a series of hardware description language commands and to reduce this series of commands to a series of net expressions, wherein each net expression may include one or more high impedance states and each net expression corresponds to a hardware description language command; and
(2) a high impedance state expression generator implemented on said digital computer that receives and analyzes each net expression, that determines if the net expression contains one or more high impedance states, and that associates at least one control expression with each net expression and:
   (a) if the net expression does not contain at least one high impedance state or is a net only expression, the control expression for that net expression is set equal to a null;
   (b) if the net expression contains at least one high impedance state and is a value only expression, each high impedance state in the net expression is reflected by inserting a selected bit value at each bit position in the control expression corresponding to a high impedance state that occurs in the net expression; and
   (c) if the net expression contains at least one high impedance state and is not a value only expression, the net expression is determined to be a combination of two or more net sub-expressions, the net expression is decomposed into at least two net sub-expressions, and the high impedance state expression generator is applied to each sub-expression of the net expression;
(3) a structure synthesizer implemented on said digital computer responsive to said net expressions and said control expressions and operative for developing a circuit which reflects the desired behavior; and
(4) means for using said synthesized circuit in the manufacture of an integrated circuit that embodies the functionality specified by said hardware description language commands.

19. The apparatus of claim 18, wherein said selected bit value inserted by said high impedance state expression generator is equal to 1 and the null value to be equal to 0.

20. The apparatus of claim 18, wherein said selected bit value inserted by said high impedance state expression generator is equal to 0 and the null value to be equal to 1.

21. A method for synthesizing a circuit structure in the manufacture of an integrated circuit described by a collection of one or more hardware description commands, the method comprising the steps of:
(1) reducing each hardware description language command to one or more net expressions;
(2) selecting one of the net expressions;
(3) determining if the selected net expression can produce at least one high impedance state;
(4) if the selected net expression cannot produce a high impedance state, assigning a control expression for the selected net expression equal to a null value and returning to step (2);
(5) if the selected net expression can produce a high impedance state and the selected net expression is a net only expression, assigning a control expression for the selected net expression equal to a null value and returning to step (2);
(6) if the selected net expression has at least one high impedance state and the selected net expression is not a net only expression, determining if the selected net expression is a value only expression;
(7) if the selected net expression is a value only expression and does not produce at least one high impedance state, assigning the selected net expression a null value and proceeding to step (2);
(8) if the selected net expression is a value only expression and produces at least one high impedance state, manifesting each high impedance state in the selected net expression by inserting a selected bit value at each bit position in the control expression corresponding to a high impedance state that occurs in the selected net expression;
(9) if the selected net expression is not a value only net expression, determining that the selected net expressions is a combination of two or more net sub-expressions, decomposing the selected net expression into at least two net sub-expressions, and applying steps (2)–(9) to each sub-expressions;
(10) synthesizing a circuit specified by said hardware description language commands on a digital computer by utilizing said net expression and said control expression; and
(11) using said synthesized circuit in the manufacture of an integrated circuit that embodies the functionality specified by said hardware description language commands.

22. The method of claim 21, further comprising the step of choosing said selected bit value to be equal to 1 and choosing the null value to be equal to 0.

23. The method of claim 21, further comprising the step of choosing said selected bit value to be equal to 0 and choosing the null value to be equal to 1.

* * * * *